United States Patent [19]

Rahman et al.

[11] Patent Number: 5,665,517

[45] Date of Patent: Sep. 9, 1997

[54] ACIDIC ION EXCHANGE RESIN AS A CATALYST TO SYNTHESIZE A NOVOLAK RESIN AND PHOTORESIST COMPOSITION THEREFROM

[75] Inventors: M. Dalil Rahman, Flemington, N.J.; Daniel P. Aubin, Voluntown, Conn.; Elaine G. Kokinda, Somerville; Dana L. Durham, Flemington, both of N.J.

[73] Assignee: Hoechst Celanese Corporation, Somerville, N.J.

[21] Appl. No.: 587,874

[22] Filed: Jan. 11, 1996

[51] Int. Cl.[6] .................. G03F 7/004; C08F 6/00; C02F 1/42
[52] U.S. Cl. ............ 430/270.1; 430/311; 528/137; 528/482; 210/683; 210/685
[58] Field of Search .................. 430/168, 169, 430/311, 270.1; 528/482, 137; 210/685, 683

[56] References Cited

U.S. PATENT DOCUMENTS

| | | | |
|---|---|---|---|
| 2,929,808 | 4/1960 | Ross et al. | 260/94.9 |
| 4,033,909 | 7/1977 | Papa | 260/482 |
| 4,033,910 | 7/1977 | Papa | 260/25 F |
| 4,195,138 | 3/1980 | Ward | 525/404 |
| 4,250,031 | 2/1981 | Uejima et al. | 210/688 |
| 4,452,883 | 6/1984 | Frenchik et al. | 430/502 |
| 4,567,130 | 1/1986 | Held | 430/294 |
| 4,584,261 | 4/1986 | Held | 430/294 |
| 4,636,540 | 1/1987 | Warfel | 523/310 |
| 4,721,665 | 1/1988 | Dooley et al. | 430/270 X |
| 4,747,954 | 5/1988 | Vaughn et al. | |
| 4,784,937 | 11/1988 | Tanaka et al. | 430/331 |
| 4,833,067 | 5/1989 | Tanaka et al. | 430/331 |
| 4,914,006 | 4/1990 | Kato et al. | 430/331 |
| 5,073,622 | 12/1991 | Wojtech et al. | 528/486 |
| 5,116,715 | 5/1992 | Roland | 430/190 |
| 5,118,787 | 6/1992 | Furuno | 528/482 |
| 5,175,078 | 12/1992 | Aoyama et al. | 430/331 |
| 5,212,044 | 5/1993 | Liang et al. | 430/270 X |
| 5,284,930 | 2/1994 | Matsumoto et al. | 528/482 |
| 5,286,606 | 2/1994 | Rahman et al. | 430/311 |
| 5,300,628 | 4/1994 | Honda | 528/482 |
| 5,346,799 | 9/1994 | Jeffries, III et al. | 430/192 |
| 5,350,714 | 9/1994 | Trefonas, III et al. | 210/663 X |
| 5,378,802 | 1/1995 | Honda | 210/660 X |
| 5,446,125 | 8/1995 | Honda et al. | 528/486 |
| 5,472,616 | 12/1995 | Szmanda et al. | 210/683 |
| 5,478,691 | 12/1995 | Miyashita et al. | 430/192 |
| 5,500,127 | 3/1996 | Carey et al. | 210/685 |
| 5,521,052 | 5/1996 | Rahman et al. | 430/270.1 |
| 5,576,139 | 11/1996 | Uenishi et al. | 430/192 |

FOREIGN PATENT DOCUMENTS

| | | |
|---|---|---|
| 544324 | 6/1993 | European Pat. Off. . |
| 544325 | 6/1993 | European Pat. Off. . |
| A-0588492 | 3/1994 | European Pat. Off. . |
| 1-072155 | 3/1989 | Japan . |
| 1-228560 | 9/1989 | Japan . |
| 4-65415 | 3/1992 | Japan . |
| 1509354 | 5/1978 | United Kingdom . |
| WO90/01726 | 2/1990 | WIPO . |
| WO93/12152 | 6/1993 | WIPO . |
| WO93/18437 | 9/1993 | WIPO . |
| WO94/01807 | 1/1994 | WIPO . |
| WO94/12912 | 6/1994 | WIPO . |
| WO94/14858 | 7/1994 | WIPO . |
| WO94/14862 | 7/1994 | WIPO . |
| WO94/14863 | 7/1994 | WIPO . |
| WO96/12214 | 4/1996 | WIPO . |
| WO96/20965 | 7/1996 | WIPO . |
| WO96/21175 | 7/1996 | WIPO . |
| WO96/21176 | 7/1996 | WIPO . |
| WO96/21211 | 7/1996 | WIPO . |

OTHER PUBLICATIONS

Bayard; "Water Free of Heavy Metals for Medical Use and Ion Exchange Resin Used in its Preparation" Nov. 16, 1992; CA98(26):221589z.

Hirai et al; "Treatment of Waste Waters Containing Formaldehyde and Metals with Chelating Ion Exchange Resins"; Nov. 5, 1975; CA84(14):95328j.

Kimura et al; "Purification of Formaldehyde"; Mar. 9, 1977; CA87(7):52776y.

T. Tanada; "A New Photolithography Tech. with Antireflective . . . "; Journal of the Electrochemical Society, vol. 137, No. 12, pp. 393900–393905; Dec. 1990, Manchester, New Hampshire.

Rohm and Haas Company; "Amberlite Ion Exchange Resins Laboratory Guide"; Sep. 1979; Philadelphia, Pa.

JP-A-1190713 Inatomi, Shigeki et al, Jul. 31, 1989; Chemical Abstracts, vol. 112, No. 18, Apr. 30, 1990, Columbus, OH, p. 17, the Abstract 159201u.

G. Noti et al, "Deionized Water Plants for Semiconductor Device Fabrication", Proceedings of the Inst:Radio and Electron. Eng, Aust.(Australia), vol. 34, No. 2, Mar. 1973, pp. 45–51.

Derwent Publications Ltd., London, GB; JP-A-05 234 876 (OCG Microelectronic Materials), Sep. 10, 1993.

"Rearrangement of Novolak Resins", Rahman et al, SPIE, 1994.

"The Effect of Lewis Bases on the Molecular Weight of Novolak Resins" Rahman et al Ellenville 1994.

"Nature and Degree of Substitution Patterns in Novolaks by Carbon–13 NMR Spectroscopy" Khadim et al SPIE 1993.

*Primary Examiner*—John S. Chu
*Attorney, Agent, or Firm*—Andrew F. Sayko, Jr.

[57] ABSTRACT

The present invention provides methods for producing water insoluble, aqueous alkali soluble novolak resins having consistent molecular weight and a very low level of metal ions, utilizing a solid acid condensation catalyst. A method is also provided for producing photoresist composition having a very low level of metal ions from such novolak resins and for producing semiconductor devices using such photoresist compositions.

8 Claims, No Drawings

5,665,517

ACIDIC ION EXCHANGE RESIN AS A CATALYST TO SYNTHESIZE A NOVOLAK RESIN AND PHOTORESIST COMPOSITION THEREFROM

BACKGROUND OF THE INVENTION

The present invention relates to a process for producing a novolak resin having a consistent molecular weight and a very low level of metal ions, especially sodium and iron, by using an acidic ion exchange resin as a catalyst in the production of such a novolak resin and to a process for using such a novolak resin in light-sensitive compositions. Further, the present invention relates to a process for coating substrates with these light-sensitive compositions as well as the process of coating, imaging and developing these light-sensitive mixtures on a substrate.

Photoresist compositions are used in microlithography processes for making miniaturized electronic components, such as in the fabrication of computer chips and integrated circuits. Generally, in these processes, a thin coating of film of a photoresist composition is first applied to a substrate material, such as a silicon wafer, used for making integrated circuits. The coated substrate is then baked to evaporate any solvent in the photoresist composition and to fix the coating onto the substrate. The baked coated surface of the substrate is next subjected to an image-wise exposure to radiation.

This radiation exposure causes a chemical transformation in the exposed areas of the coated surface. Visible light, ultraviolet (UV) light, electron beam and X-ray radiant energy are radiation types commonly used today in microlithographic processes. After this image-wise exposure, the coated substrate is treated with a developer solution to dissolve and remove either the radiation-exposed or the unexposed areas of the coated surface of the substrate.

Metal contamination has been a problem for a long time in the fabrication of high density integrated circuits and computer chips, often leading to increased defects, yield losses, degradation and decreased performance. In plasma processes, metals such as sodium and iron, when they are present in photoresists, can cause contamination, especially during plasma stripping. However, these problems can be overcome to a substantial extent during the fabrication process, e.g. by utilizing HCl gettering of the contaminants during a high temperature anneal cycle.

As semiconductor devices have become more sophisticated, these problems have become much more difficult to overcome. When silicon wafers are coated with a liquid positive photoresist which is subsequently stripped off, such as with oxygen microwave plasma, the performance and stability of the semiconductor device is often seen to decrease. As the plasma stripping process is repeated, more degradation of the device frequently occurs. A primary cause of such problems has been found to be the metal ion contamination in the photoresist, particularly sodium and iron ions. Metal levels of less than 1.0 ppm in the photoresist have been found to adversely affect the properties of such semiconductor devices.

Novolak resins are frequently used as a polymeric binder in liquid photoresist formulations. These resins are typically produced by conducting a condensation reaction between formaldehyde and one or more multi-substituted phenols, in the presence of an acid catalyst, such as oxalic acid or maleic anhydride. In producing sophisticated semiconductor devices, it has become increasingly important to provide novolak resin having metal contamination levels well below 1.0 ppm. During raw materials purification to remove metals, a very minor mount of nitrogen base is frequently also removed. In the absence of such nitrogen base, the production of novolak resin often failed because of the depolymerisation of resin that occured during the high temperature distillation step of the process.

There are two types of photoresist compositions, negative-working and positive-working. When negative-working photoresist compositions are exposed image-wise to radiation, the areas of the resist composition exposed to the radiation become less soluble to a developer solution (e.g. a cross-linking reaction occurs) while the unexposed areas of the photoresist coating remain relatively soluble to such a solution. Thus, treatment of an exposed negative-working resist with a developer causes removal of the non-exposed areas of the photoresist coating and the creation of a negative image in the coating, thereby uncovering a desired portion of the underlying substrate surface on which the photoresist composition was deposited.

On the other hand, when positive-working photoresist compositions are exposed image-wise to radiation, those areas of the photoresist composition exposed to the radiation become more soluble to the developer solution (e.g. a rearrangement reaction occurs), while those areas not exposed remain relatively insoluble to the developer solution. Thus, treatment of an exposed positive-working photoresist with the developer causes removal of the exposed areas of the coating and the creation of a positive image in the photoresist coating. Again, a desired portion of the underlying substrate surface is uncovered.

After this development operation, the now partially unprotected substrate may be treated with a substrate-etchant solution or plasma gases and the like. The etchant solution or plasma gases etch that portion of the substrate where the photoresist coating was removed during development. The areas of the substrate where the photoresist coating still remains are protected and, thus, an etched pattern is created in the substrate material which corresponds to the photomask used for the image-wise exposure of the radiation. Later, the remaining areas of the photoresist coating may be removed during a stripping operation, leaving a clean etched substrate surface. In some instances, it is desirable to heat treat the remaining photoresist layer, after the development step and before the etching step, to increase its adhesion to the underlying substrate and its resistance to etching solutions.

Positive working photoresist compositions are currently favored over negative working resists because the former generally have better resolution capabilities and pattern transfer characteristics. Photoresist resolution is defined as the smallest feature which the resist composition can transfer from the photomask to the substrate with a high degree of image edge acuity after exposure and development. In many manufacturing applications today, resist resolution on the order of less than one micron are necessary. In addition, it is almost always desirable that the developed photoresist wall profiles be nearly vertical relative to the substrate. Such demarcations between developed and undeveloped areas of the resist coating translate into accurate pattern transfer of the mask image onto the substrate.

DESCRIPTION OF THE PRIOR ART

In the recent years there has been significant progress in novolak resin synthesis. It has reported that under vigorous synthetic conditions the structure of novolak resin changes, especially when a high concentration of acid catalyst and high temperature is used. Rahman et al, "Rearrangement of Novolak Resin", presented at SPIE conference, 1994; Khadim et al "The Nature and Degree of Substitution Patterns in Novolaks by Carbon-13 NMR Spectroscopy", presented at SPIE conference, 1993. In a typical novolak reaction, a reactor is charged with phenolic compounds, an acid catalyst such as oxalic acid, maleic acid (maleic anhydride), p-toluene sulphonic acid or any mineral acid, and heated to about 95° to 100° C. Formaldehyde is slowly added and the mixture is heated at reflux for about 6 hours. At the end of this condensation period, the reactor is converted to distillation, and the temperature is raised to about 200° C. At this point vacuum is slowly drawn, the temperature is raised to about 220° C., and the pressure is reduced to below about 20 mm Hg. After the volatiles have been distilled off, the vacuum is released and the molten resin collected and allowed to cool. During the course of the above resin synthesis sequence, samples were taken at various temperatures and inspected using GPC (Gas Phase Chromotography). It was found that there was a decrease of the weight average molecular weight of the polymer, especially in the temperature range between 160°–190° C.( Rahman et al, "The Effect of Lewis Bases on the Molecular Weight of Novolak Resins", presented at Ellenville Conference, 1994). The molecular weight decrease was not observed unless the methyl phenol was extremely pure. If the methyl phenol contained a trace amount of nitrogen base, the molecular weight decrease during the distillation process was not observed. In copending U.S. patent applications Ser. No. 997,942, filed 12/29/1992 (WO 94/14862) and Ser. No. 999,500, filed 12/29/1992 (WO 94/14863), assigned to the same assignee as the subject application and incorporated herein by reference, an improved process is disclosed to control molecular weight by adjusting the amount of Lewis base in phenolic compounds before or after the condensation. It was disclosed that during the purification process of phenolic compounds using an ion exchange resin, distillation, and/or a solvent extraction process, to remove metal ions, the minor amount of base present was also removed. Due to the absence of these bases, the novolak resin was partially depolymerized during the manufacturing process. The physical properties of the depolymerized resin changed due to degradation and it was not useful for use in photoresist compositions. This problem can be substantially avoided by adjusting the Lewis acid level, such as by adding a minor mount of a Lewis base before or after the condensation step of the novolak manufacturing process.

In copending U.S. patent application Ser. No. 366,634, filed on Dec. 30, 1994, assigned to the same assignee as the subject application and incorporated herein by reference, an improved process is disclosed for isolating a novolak resin at a temperature less than about 140° C. by using subsurface forced steam distillation to avoid high temperature molecular weight breakdown of the resin. It is known that an alkali soluble novolak resin can be made by the condensation reaction of a mixture of phenolic monomers with an aldehyde source. Such novolak resin synthesis processes are disclosed in U.S. Pat. No. 5,346,799, incorporated herein by reference.

SUMMARY OF THE INVENTION

It has now been found that the novolak resin synthesis process can be further improved by utilizing a solid acid catalyst, which can act as a catalyst for the condensation reaction as well as removing metal ions. The solid catalyst will be removed after condensation, such as by filtration, so that it will not cause any depolymerization during a high temperature distillation process.

The present invention relates to a process for producing a novolak resin having a consistent molecular weight, and a low level of metal ions, especially sodium and iron, and for using such a novolak resin in light-sensitive compositions. The invention also relates to a photoresist composition containing such a novolak resin and to a process for producing such photoresists compositions. The invention further relates to the process of removing solid acid catalyst from the phenolic compounds-formaldehyde condensation products prior to high temperature distillation process, to produce a novolak resin having a substantially consistent weight average molecular weight (i.e. varying by +/–10% or less). The invention further relates to process for producing semiconductor devices using such photoresists containing such a novolak resin and a photosensitizer.

The subject invention provides a water insoluble, aqueous alkali soluble, film forming novolak resin obtained by condensing with formaldehyde one or more phenolic compounds, such as meta-cresol, para-cresol, 3,5-dimethylphenol or 2,4-dimethylphenol. The novolak resins obtained have a very low level of metal ions such as iron, sodium, potassium, calcium, magnesium, copper and zinc. The metal ion level should be less than 200 ppb each. Sodium and iron are the most common metal ion contaminants and among the easiest to detect. The level of these metal ions serves as an indicator of the level of other metal ions. The level of sodium and iron ions, are preferably less than 100 ppb each, more preferably less than 50 ppb each, even more preferably less than 20 ppb each, and most preferably less than about 10 ppb each.

Water insoluble, aqueous alkali soluble, film forming novolak resin having a very low levels of metal ions may be obtained by condensing formaldehyde, having a very low level of metal ions, with one or more phenolic compounds, such as m-cresol, p-cresol, 2,4 and 2,5-dimethylphenol, having a very low level of metal ions. The condensation reaction is carded out in the presence of a solid acid catalyst, such as oxalic acid, maleic acid, maleic anhydride or p-toluene sulphonic acid. In a preferred embodiment of the process of the present invention, the solid acid catalyst is removed, such as by filtration, prior to high temperature distillation to obtain a novolak resin having a very consistent weight average molecular weight and a very low level of metal ions. In the absence of a statement to the contrary, molecular weight shall mean weight average molecular weight.

The present invention provides a process for producing a novolak resin having a consistent molecular weight and a with very low level of metal ions, particularly sodium and iron. The subject process comprises:

a) condensing formaldehyde with one or more phenolic compounds, in the presence of a solid acid catalyst, such as an acidic ion exchange resin, more preferably a strongly acidic ion exchange resin, such as Amberlyst® A-15 resin, and most preferably a mixture of a strongly acidic ion exchange resin such as Amberlyst® A-15 resin and a chelating ion exchange resin (an ion exchange resin having one or more chelating sites to which may be attracted and bonded metals such as iron), such as Amberlyst® IRC-718 in its acidic form;

b) after the condensation removing the catalyst, such as by filtration; and c) removing the unreacted phenolic compounds, such as by distillation, and thereby producing a water insoluble, aqueous alkali soluble, film forming novolak resin having a consistent molecular weight and a sodium and iron ion level off less than 200 ppb each, preferably less than 100 ppb, more preferably less than 50 ppb, even more preferably less than 20 ppb, and most preferably less than about 10 ppb each.

The present invention further provides a process for producing a positive photoresist composition having a very low level of total sodium and iron ions. The subject process comprises:

a) condensing formaldehyde with one or more phenolic compounds, in the presence of a solid acid catalyst, such as an acidic ion exchange resin, more preferably a strongly acidic ion exchange resin such as Amberlyst® A-15 resin, and most preferably a mixture of strongly acidic ion exchange resin such as Amberlyst® A-15 resin and a chelating ion exchange resin such as Amberlyst® IRC-718 in its acidic form;

b) after the condensation removing the catalyst, such as by filtration; and c) removing the unreacted phenolic compounds, such as by distillation, and thereby producing a water insoluble, aqueous alkali soluble, film forming novolak resin having a consistent molecular weight and a sodium and iron ion level of less than 200 ppb each, preferably less than 100 ppb, more preferably less than 50 ppb, even more preferably less than 20 ppb, and most preferably less than about 10 ppb each;

d) providing an admixture of: 1) a photosensitive component in an amount sufficient to photosensitize the photoresist composition; 2) the water insoluble, aqueous alkali soluble, fill forming novolak resin and 3) a suitable photoresist solvent, and thereby forming a photoresist composition.

The invention further provides a method for producing a semiconductor device by producing a photo-image on a substrate by coating a suitable substrate with a positive working photoresist composition by:

a) condensing formaldehyde with one or more phenolic compounds, in the presence of a solid acid catalyst, such as an acidic ion exchange resin, more preferably a strongly acidic ion exchange resin such as Amberlyst® A-15 resin, and most preferably a mixture of strongly acidic ion exchange resin such as Amberlyst® A-15 resin and a chelating ion exchange resin such as Amberlyst® IRC-718 in its acidic form;

b) after the condensation removing the catalyst, such as by filtration; and c) removing the unreacted phenolic compounds, such as by distillation, and thereby producing a water insoluble, aqueous alkali soluble, film forming novolak resin having a consistent molecular weight and a sodium and iron ion level off less than 200 ppb each, preferably less than 100 ppb, more preferably less than 50 ppb, even more preferably less than 20 ppb, and most preferably less than about 10 ppb each;

d) providing an admixture of: 1) a photosensitive component in an amount sufficient to photosensitize the photoresist composition; 2) the water insoluble, aqueous alkali soluble, film forming novolak resin and 3) a suitable photoresist solvent and thereby forming a photoresist composition;

e) coating a suitable substrate with the photoresist composition;

f) heat treating the coated substrate until substantially all of the photoresist solvent is removed; image-wise exposing the photoresist composition and removing the image-wise exposed areas of such composition with a suitable developer, such as an aqueous alkaline developer. Optionally one may also perform a baking of the substrate either immediately before or after the removing step.

DESCRIPTION OF THE PREFERRED EMBODIMENT

An acidic ion exchange resin, such as a styrene/divinylbenzene cation exchange resin can be utilized in the present process. Such ion exchange resins are available from Rohm and Haas Company, e.g. AMBERLYST® 15 ion exchange resin.

The formaldehyde is preferably passed, as a solution, through a column containing the acidic ion exchange resin, e.g. a solution of about 38 percent formaldehyde in water and methanol. Such solutions typically contain from at least 250 to 1000 ppb each of sodium and iron ions. During the process of the present invention, these levels are each reduced to as low as less than about 10 ppb each.

The phenolic compounds condensed with the purified formaldehyde must also have a low level of metal ions. Such low levels may be achieved by distilling such phenolic compounds so that the sodium and iron ion content is as low as 50 ppb each or less. Such low levels may also be obtained by passing the phenolic compounds through the acidic ion exchange resin column, so that the sodium and iron ion content is as low as 30 ppb each, or less. Another method to obtain such low levels is by solvent extraction, e.g. phenolic compounds can be extracted with 10% acid solution in water to remove metal ions to a level as low as 30 ppb each, or less.

The present invention provides a novolak resin, a photoresist composition containing such a novolak resin and a process for producing semiconductor devices using such a photoresist composition. The photoresist composition is formed by providing an admixture of a photosensitizer, the subject water insoluble, aqueous alkali soluble novolak resin and a suitable photoresist solvent. Suitable solvents for such photoresists and for novolak resins may include propylene glycol mono-alkyl ether, propylene glycol alkyl (e.g. methyl) ether acetate, 2-heptanone, ethyl-3-ethoxypropionate, ethyl lactate, mixtures of ethyl-3-ethoxypropionate and ethyl lactate, butyl acetate, xylene, diglyme, ethylene glycol monoethyl ether acetate. The preferred solvents are propylene glycol methyl ether acetate (PGMEA), 2-heptanone, ethyl lactate and ethyl-3-ethoxypropionate (EEP).

Other optional ingredients such as colorants, dyes, anti-striation agents, leveling agents, plasticizers, adhesion promoters, speed enhancers, solvents and such surfactants as non-ionic surfactants may be added to the solution of novolak resin, sensitizer and solvent before the photoresist composition is coated onto a substrate. Examples of dye additives that may be used together with the photoresist compositions of the present invention include Methyl Violet 2B (C.I. No. 42535), Crystal Violet (C.I. 42555), Malachite Green (C.I. No. 42000), Victoria Blue B (C.I. No. 44045) and Neutral Red (C.I. No. 50040) at one to ten percent weight levels, based on the combined weight of novolak and sensitizer. The dye additives help provide increased resolution by inhibiting back scattering of light off the substrate.

Anti-striation agents may be used at up to about a five percent weight level, based on the combined weight of novolak and sensitizer. Plasticizers which may be used include, for example, phosphoric acid tri-(beta-chloroethyl)

-ester; stearic acid; dicamphor; polypropylene; acetal resins; phenoxy resins; and alkyl resins, at about one to ten percent weight levels, based on the combined weight of novolak and sensitizer. The plasticizer additives improve the coating properties of the material and enable the application of a film that is smooth and of uniform thickness to the substrate.

Adhesion promoters which may be used include, for example, beta-(3,4-epoxy-cyclohexyl)-ethyltrimethoxysilane; p-methyl-disilane-methyl methacrylate; vinyltrichlorosilane; and gamma-amino-propyl triethoxysilane up to about a 4 percent weight level, based on the combined weight of novolak and sensitizer. Development speed enhancers that may be used include, for example, picric acid, nicotinic acid or nitrocinnamic acid up to about a 20 percent weight level, based on the combined weight of novolak and sensitizer. These enhancers tend to increase the solubility of the photoresist coating in both the exposed and unexposed areas, and thus they are used in applications when speed of development is the overriding consideration even though some degree of contrast may be sacrificed; i.e., while the exposed areas of the photoresist coating will be dissolved more quickly by the developer, the speed enhances will also cause a larger loss of photoresist coating from the unexposed areas.

The solvents may be present in the overall composition in an amount of up to 95% by weight of the solids in the composition. Solvents, of course are substantially removed after coating of the photoresist solution on a substrate and drying. Non-ionic surfactants that may be used include, for example, nonylphenoxy poly(ethyleneoxy) ethanol; octylphenoxy ethanol at up to about 10% weight levels, based on the combined weight of novolak and sensitizer.

The prepared photoresist solution, can be applied to a substrate by any conventional method used in the photoresist art, including dipping, spraying, whirling and spin coating. When spin coating, for example, the resist solution can be adjusted with respect to the percentage of solids content, in order to provide coating of the desired thickness, given the type of spinning equipment utilized and the amount of time allowed for the spinning process. Suitable substrates include silicon, aluminum, polymeric resins, silicon dioxide, doped silicon dioxide, silicon nitride, tantalum, copper, polysilicon, ceramics, aluminum/copper mixtures; gallium arsenide and other such Group III/V compounds.

The photoresist coatings produced by the described procedure are particularly suitable for application to thermally grown silicon/silicon dioxide-coated wafers, such as are utilized in the production of microprocessors and other miniaturized integrated circuit components. An aluminum/aluminum oxide wafer can also be used. The substrate may also comprise various polymeric resins, especially transparent polymers such as polyesters. The substrate may have an adhesion promoted layer of a suitable composition, such as one containing hexa-alkyl disilazane.

The photoresist composition solution is then coated onto the substrate, and the substrate is treated at a temperature from about 70° C. to about 110° C. for from about 30 seconds to about 180 seconds on a hot plate or for from about 15 to about 90 minutes in a convection oven. This temperature treatment is selected in order to reduce the concentration of residual solvents in the photoresist, while not causing substantial thermal degradation of the photosensitizer. In general, one desires to minimize the concentration of solvents and this first temperature treatment is conducted until substantially all of the solvents have evaporated and a thin coating of photoresist composition, on the order of one micron in thickness, remains on the substrate. In a preferred embodiment the temperature is from about 85° C. to about 95° C. The treatment is conducted until the rate of change of solvent removal becomes relatively insignificant. The temperature and time selection depends on the photoresist properties desired by the user, as well as the equipment used and commercially desired coating times. The coated substrate can then be exposed to actinic radiation, e.g., ultraviolet radiation, at a wavelength of from about 300 nm to about 450 nm, x-ray, electron beam, ion beam or laser radiation, in any desired pattern, produced by use of suitable masks, negatives, stencils, templates, etc.

The photoresist is then optionally subjected to a post exposure second baking or heat treatment either before or after development. The heating temperatures may range from about 90° C. to about 120° C., more preferably from about 100° C. to about 110° C. The heating may be conducted for from about 30 seconds to about 2 minutes, more preferably from about 60 seconds to about 90 seconds on a hot plate or about 30 to about 45 minutes by convection oven.

The exposed photoresist-coated substrates are developed to remove the image-wise exposed areas by immersion in an alkaline developing solution or developed by spray development process. The solution is preferably agitated, for example, by nitrogen burst agitation. The substrates are allowed to remain in the developer until all, or substantially all, of the photoresist coating has dissolved from the exposed areas. Developers may include aqueous solutions of ammonium or alkali metal hydroxides. One preferred hydroxide is tetramethyl ammonium hydroxide. After removal of the coated wafers from the developing solution, one may conduct an optional post-development heat treatment or bake to increase the coating's adhesion and chemical resistance to etching solutions and other substances. The post-development heat treatment can comprise the oven baking of the coating and substrate below the coating's softening point. In industrial applications, particularly in the manufacture of microcircuitry units on silicon/silicon dioxide-type substrates, the developed substrates may be treated with a buffered, hydrofluoric acid base etching solution. The photoresist compositions of the present invention are resistant to acid-base etching solutions and provide effective protection for the unexposed photoresist-coating areas of the substrate.

The following specific examples will provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention.

EXAMPLE 1

150 grams of cresols consisting of 6.3 moles of m-cresol and 3.0 moles of 3,5-xylenol was transferred to a four necked flask equipped with a condenser, a thermometer, and a dropping funnel. Three grams of Amberlyst® A-15 Wet Resin (2% by weight of the cresols) was added and the flask was heated to 95° C. 84.24 g of formaldehyde (molar ratio of cresol/formaldehyde 1/0.78) was added dropwise over one and a half hours. The reaction was allowed to continue for 12 hours at 95° C. Propylene glycol methyl ether acetate (PGMEA, 150 ml.) was added and the ion exchange beads were separated by filtration. The unreacted raw cresols, water, and the solvent were removed by distillation. The resin was isolated as molten to an aluminum tray. The GPC molecular weight was found to be 2776. The sodium and iron ion levels were, respectively, 22 ppb and 19 ppb.

EXAMPLE 2

150 grams of cresols consisting of 6.3 moles of m-cresol and 3.0 moles of 3,5-xylenol was transferred to a four necked flask equipped with a condenser, a thermometer, and a dropping funnel. Six grams of Amberlyst® A-15 Wet Resin (4% by weight of the cresols) and 100 grams of dipropylene glycol methyl ether (DPGME) were added and the flask was heated to 95° C. 84.67 g of formaldehyde (molar ratio of cresol/formaldehyde 1/0.78) was added dropwise over one and a half hours. The reaction was allowed to continue for 12 hours at 95° C. DPGME (100 ml.) was added and the ion exchange beads were separated by filtration. The unreacted raw cresols, water, and the solvent were removed by distillation. The resin was isolated in its molten form in an aluminum tray. GPC molecular weight was found to be 3091. The sodium and iron ion content in the resin was 29 ppb and 23 ppb, respectively.

EXAMPLE 3

150 grams of cresols consisting of 5.0 mole of m-cresol and 3.0 mole of 3,5-xylenol was transferred to a four necked flask equipped with a condenser, a thermometer, and a dropping funnel. Four grams of Amberlyst® A-15 Wet Resin (2.66% by weight of the cresols) and 2.0 grams of Amberlyst® IRC-718 acid form (1.33%) were added. 100 grams of 3-methoxy-3-methyl butanol (MMB) were added and the flask was heated to 95° C. 84.41 g of formaldehyde (molar ratio of cresol/formaldehyde 1/0.80) was added dropwise over one and a half hours. The reaction was allowed to continue for 6 hours at 95° C. 100 ml. of MMB was added and the ion exchange beads were separated by filtration. The unreacted raw cresols, water, and the solvent were removed by distillation. The resin was isolated as molten to an aluminum tray. GPC molecular weight was found to be 3,644. The sodium and iron ion content in the resin was 60 ppb and 19 ppb, respectively.

EXAMPLES 4 AND 5

A 50 gram photoresist test sample was prepared according to the following formulation:

| | |
|---|---|
| RI-292 (mixed ester of trihydroxyphenylethane 70% 2,1,4- and 30% 2,1,5- diazonaphthoquinone sulfonyl chloride) | 2.51 gm |
| Resin for Example 1 | 11.46 gm |
| PGMEA | 36.00 gm |
| 10% FC-430 (fluoroaliphatic polymeric ester (98.5%) Toluene (1.5%) available from 3M Corp.) as a PGMEA solution | 0.13 gm |

The resist sample from Example 1 was coated on a hexamethyldisilazane (HMDS) primed silicon wafer to 1.29 mm thickness using a soft bake at 110° C. for 60 seconds on an I-line hot plate (SVG® 8100). The resin sample from Example 2 was also coated to 1.29 mm thickness on such a silicon wafer by the same procedure. The exposure matrix was printed on the coated wafers using a 0.54 NA NIKON® i-line stepper and a NIKON® resolution reticle. The exposed wafers were PEB (post exposure baked) at 110° C. for 60 seconds on a in line hot plate. The wafers were then developed using AZ® 300 MIF TMAH (tetramethyl ammonium hydroxide-2.38%) developer. The developed wafers were examined using a HITACHI®S-400 SEM (scanning electron microscope). A nominal dose (Dose to Print, DTP) is measured at the best focus, the dose required to precisely replicate a given feature. DTP, resolution and depth of focus (DOF) were measured and are shown in Table 1 below.

TABLE 1

| Example # | Resin From | RMW | DTC (Dose to Clear) | DTP | Resolution | DOF |
|---|---|---|---|---|---|---|
| 4 | Example 1 | 8.8 | 100 | 190 | 0.4 | (−.4/.2) |
| 5 | Example 2 | 8.7 | 180 | 335 | 0.35 | (−.6/.2) |

Solution Viscosity - Relative Molecular Weight (RMW)

The viscosity solution was prepared by dissolving 7 grams resin in a 100 ml. volumetric flask using cyclohexanone solvent. The solution was filtered using a 5 micron pressure syringe filter. The viscosity was measured using a Cannon-Fenske® #200 viscometer at 25° C. The relative molecular weight (RMW) was determined using the following equation:

$RMW = \{\log(n/no)/c\}^2$ where c=concentration of resin in g/ml.
n=viscosity of resin in cyclohexanone
no=viscosity of cyclohexanone Spin Speed Determinations for 1.6 μm Films For each sample, spin one wafer at the following speeds: 2000, 4000 and 6000 rpm/30 sec. Bake all wafers at 90° C./30 minutes. Measure film thickness at n=1.64 and interpolate the speed required to obtain 1.61 μm by logarithmic (base 10) regression.

Molecular Weight Data (Mw and Mn)

The molecular weight of the polymers, whether weight average molecular weight Mw, or number average molecular weight Mn, were measured by gel permeation chromatography (GPC) performed on dilute solutions of the polymer in tetrahydrofuran (THF). The actual apparatus employed consisted of a Waters (Millipore Corp.) programmable automatic sampler, vacuum pump, chromatography columns with heater, and a differential refractometer connected to a Shimadzu® CR 30A data reduction system with accompanying software (version 1.1, Shimadzu® part No. T/N 22301309-91). The refractometer used was a Waters® model 410 and four chromatography columns, 500 Angstrom, 1000 Angstrom, 10.000 Angstrom and 100,000 Angstrom (available from Waters) were connected in series. The system was calibrated using multiple available polystyrene standards ranging in molecular weight as follows:

GPC CALIBRATION

| Calibration Standard (Polystyrene) | Mol. Wt. |
|---|---|
| 1 | 470,000 |
| 2 | 170,000 |
| 3 | 68,000 |
| 4 | 34,500 |
| 5 | 9,200 |
| 6 | 3,200 |
| 7 | 1,250 |

The standards are essentially monodisperse, consisting substantially of a single molecular weight. With the system thus calibrated the weight average molecular weight Mw, the number average molecular weight Mn, and polydispersity. Mw/Mn, were obtained for polymers produced in accordance with the examples given hereinafter.

We claim:

1. A method for producing a water insoluble, aqueous alkali soluble novolak resin comprising:
   a) condensing formaldehyde with one or more phenolic compounds, in the presence of a solid acid catalyst, said catalyst being a solid acid catalyst which can be separated by filtration after the condensation reaction, wherein said acid catalyst is an acidic ion exchange resin which is insoluble in substituted phenols, formaldehyde, propylene glycol methyl ether acetate, dipropylene glycol methyl ether, and 3-methoxy-3-methyl butanol;
   b) after the condensation, removing the solid catalyst; and
   c) removing the unreacted phenolic compounds and thereby producing a water insoluble, aqueous alkali soluble, film forming novolak resin having a sodium and iron ion level of less than 200 ppb each.

2. The method of claim 1 where in the sodium and iron ion level is reduced to less than 100 ppb each.

3. A method for producing a positive photoresist composition comprising:
   a) condensing formaldehyde with one or more phenolic compounds, in the presence of an acid catalyst, said catalyst being a solid acid catalyst which can be separated by filtration after the condensation reaction, wherein said acid catalyst is an acidic ion exchange resin which is insoluble in substituted phenols, formaldehyde, propylene glycol methyl ether acetate, dipropylene glycol methyl ether, and 3-methoxy-3-methyl butanol;
   b) after the condensation, removing the catalyst; and
   c) removing the unreacted phenolic compounds and thereby producing a water insoluble, aqueous alkali soluble, film forming novolak resin having a sodium and iron ion level of less than 200 ppb each;
   d) providing an admixture of: 1)a photosensitive component in an amount sufficient to photosensitize a photoresist composition; 2) the water insoluble, aqueous alkali soluble, film forming novolak resin of c) and 3) a suitable photoresist solvent, and thereby forming a photoresist composition.

4. The method of claim 3 wherein the sodium and iron ion level is reduced to less than 100 ppb each.

5. The method of claim 3 wherein said photoresist solvent is selected from the group consisting of propylene glycol methyl ether acetate, ethyl lactate, 2-heptanone, and ethyl-3-ethoxypropionate.

6. A method for producing a semiconductor device by producing a photo-image on a suitable substrate comprising:
   a) condensing formaldehyde with one or more phenolic compounds, in the presence of an acid catalyst, said catalyst being a solid acid catalyst which can be separated by filtration after the condensation reaction, wherein said acid catalyst is an acidic ion exchange resin which is insoluble in substituted phenols, formaldehyde, propylene glycol methyl ether acetate, dipropylene glycol methyl ether, and 3-methoxy-3-methyl butanol;
   b) after the condensation, removing the catalyst; and
   c) removing the unreacted phenolic compounds and thereby producing a water insoluble, aqueous alkali soluble, film forming novolak resin having a sodium and iron ion level of less than 200 ppb each;
   d) providing an admixture of: 1) a photosensitive component in an amount sufficient to photosensitize a photoresist composition; 2) the water insoluble, aqueous alkali soluble, film forming novolak resin of c) and 3) a suitable photoresist solvent and thereby forming a photoresist composition;
   e) costing a suitable substrate with the photoresist composition;
   f) heat treating the coated substrate of e) until substantially all of the photoresist solvent is removed; image-wise exposing the photosensitive composition and removing the image-wise exposed areas of such composition with a suitable developer, such as an aqueous alkaline developer.

7. The method of claim 6 wherein the sodium and iron ion level is reduced to less than 100 ppb each.

8. The method of claim 6 wherein said photoresist solvent is selected from the group consisting of propylene glycol methyl ether acetate, ethyl lactate, 2-heptanone, and ethyl-3-ethoxypropionate.

* * * * *